United States Patent [19]

Hong

[11] Patent Number: 5,385,856

[45] Date of Patent: Jan. 31, 1995

[54] MANUFACTURE OF THE FIELDLESS SPLIT-GATE EPROM/FLASH EPROM

[75] Inventor: Gary Y. Hong, Hsin-Chu, Taiwan, Prov. of China

[73] Assignee: United Microelectronics Corporation, Hsinchu, Taiwan, Prov. of China

[21] Appl. No.: 160,218

[22] Filed: Dec. 2, 1993

[51] Int. Cl.$^6$ ............................................ H01L 21/266
[52] U.S. Cl. ...................................... 437/43; 437/45; 148/DIG. 116
[58] Field of Search ..................... 437/29, 30, 43, 45, 437/49, 979, 985; 148/DIG. 116, DIG. 163

[56] References Cited

U.S. PATENT DOCUMENTS

| | | | |
|---|---|---|---|
| 5,156,990 | 10/1992 | Mitchell | 437/45 |
| 5,158,902 | 10/1992 | Hanada | 437/45 |
| 5,236,853 | 8/1993 | Hsue | 437/43 |
| 5,273,926 | 12/1993 | Tigelaar | 437/43 |

Primary Examiner—Tom Thomas
Assistant Examiner—Chandra Chaudhari
Attorney, Agent, or Firm—George O. Saile; Graham S. Jones, II

[57] ABSTRACT

A device and method of manufacturing the device comprising a self-aligned, split-gate EPROM/Flash EPROM array device. Ions are implanted into locations in a doped well in a substrate to form buried bit lines, a forming a thick dielectric over the implanted ions, implanting a first threshold voltage $V_{T1}$ dopant into the doped well, formation of a first polysilicon layer on the silicon dioxide layer, forming an inter polysilicon layer on the surface of the first polysilicon layer on the device, patterning that layer by forming a mask with openings and etching through the openings in the mask, forming a second polysilicon layer on the inter polysilicon layer, forming a mask and etching portions of the second polysilicon layer to form word lines therein, and etching portions of the first polysilicon layer and the inter polysilicon dielectric to form a stacked gate beneath the word lines with a trough etched down into the well in the space defined within the buried bit lines and the second polysilicon layer, and implanting an isolation implant into the trough, whereby preliminary manufacture of the device is completed.

8 Claims, 11 Drawing Sheets

_5,385,856_

MANUFACTURE OF THE FIELDLESS SPLIT-GATE EPROM/FLASH EPROM

BACKGROUND OF THE INVENTION

1. Field of the Invention

This invention relates to EPROM thin film semiconductor memories and more particularly to split-gate EPROM/Flash EPROM devices.

2. Description of Related Art

Currently, split gate EPROM/Flash EPROM devices use field oxide to isolate bit lines electrically. Even the buried bit line is used, the field oxide used to provide isolating in the cell areas, as shown in U.S. Pat. No. 5,070,032 of Yuan et al for "Method of Making Dense Flash EEPROM Semiconductor Memory Structures."

See U.S. Pat. No. 5,045,489 of Gill et al for "Method of Making a High-Speed 2-Transistor Cell for Programmable/EEPROM Devices with Separate Read and Write Transistor."

SUMMARY OF THE INVENTION

Principal advantages of this invention are that protection is provided for an over-erase problem and a smaller cell size is possible.

This cell uses "fieldless" buried N+ configurations. The buried N+ can be contactless or the memory array requires fewer contacts. Between the active areas (bit line to bit line, word line to word line) a thin oxide, which is grown during the same step as the gate oxide, replaces a thick field oxide. In addition, a blank boron implantation is used for isolation.

Since there is no field oxidation process, which usually involves using silicon nitride to define the active area and a long, high temperature thermal oxidation process to grow a thick oxide on the field area, there is no bird's beak tolerance to affect the resolution of the photolithography. Therefore the cell size can be smaller by using the same design rule.

A device and a method of manufacture of the device comprising a self-aligned, split-gate EPROM/Flash EPROM array device is provided. The method comprises the following steps:

a) implanting ions into predetermined locations in a doped well in a semiconductor substrate of the device to form buried bit lines, b) forming a dielectric layer on the surface of the doped well forming a thick dielectric over the implanted ions, c) implanting a first threshold voltage $V_{T1}$ dopant into the doped well, d) formation of a first polysilicon layer on the silicon dioxide layer, e) forming an inter polysilicon layer on the surface of the first polysilicon layer on the device, f) patterning the first polysilicon layer by forming a mask with openings and etching the polysilicon through the openings in the mask, g) formation of a second polysilicon layer on the inter polysilicon layer, h) forming a photolithographic mask and etching portions of the second polysilicon layer to form word lines therein, and etching portions of the first polysilicon layer and the inter polysilicon dielectric to form a stacked gate beneath the word lines with a trough etched down into the well in the space defined within the buried bit lines and the second polysilicon layer, and i) implanting an isolation implant into the trough, whereby preliminary manufacture of the device is completed.

Preferably, the isolation implant comprises boron ions within the range of from about $5 \times 10^{12}/cm^2$ to about $2 \times 10^{13}/cm^2$ implanted at about 30 keV; and the trough is about 3000 Å deep; dielectric structures are formed on the sides of the gate and the word lines; and the dielectric layer is formed on the trough.

In accordance with another aspect of this invention, manufacture of a self-aligned, split-gate EPROM/Flash EPROM array device, comprises the following steps:

a) implanting ions into predetermined locations in a doped well in a semiconductor substrate of the device to form buried bit lines, b) forming a silicon dioxide layer on the surface of the doped well forming thicker oxide over the implanted ions, c) implanting a first threshold voltage $V_{T1}$ dopant into the doped well, d) formation of a first polysilicon layer on the silicon dioxide layer, e) forming an inter polysilicon layer on the surface of the first polysilicon layer on the device, f) patterning the first polysilicon layer by forming a mask with openings and etching the polysilicon through the openings in the mask, g) implanting a second threshold voltage $V_{T2}$ dopant into the doped well, h) removal of the exposed portions of the silicon dioxide layer exposing the surface of the doped well, i) forming a second silicon dioxide layer on the exposed surface of the doped well, j) formation of a second polysilicon layer on the inter polysilicon layer, k) forming a photolithographic mask and etching portions of the second polysilicon layer to form word lines therein, and etching portions of the first polysilicon layer and the inter polysilicon dielectric to form a stacked gate beneath the word lines with a trough etched down into the well in the space defined within the buried bit lines and the second polysilicon layer, and l) implanting an isolation implant into the trough, whereby preliminary manufacture of the device is completed.

Preferably, dielectric structures are formed on the sides of the gate and the word lines; and a dielectric layer is formed on the trough.

In accordance with another aspect of this invention, a self-aligned, split-gate EPROM/Flash EPROM array device, comprises:

a) a doped well in a semiconductor substrate of the device containing buried bit lines, b) a dielectric layer on the surface of the doped well with a thick dielectric over the implanted ions, c) a threshold voltage dopant in the doped well, d) first polysilicon floating gates on the silicon dioxide layer, e) an inter polysilicon layer on the surface of the first polysilicon structures f) a second polysilicon layer on the inter polysilicon layer in the form of word lines extending orthogonally to the buried bit lines and extending across the floating gates, and g) a trough extending down into the well in the space defined within the buried bit lines and the second polysilicon layer,
h) dielectric structures on the sides of the gate and the word lines,
i) an isolation implanted into the trough, and
j) a dielectric layer on the trough,
k) dielectric structures on the sides of the gate and the word lines,
l) an isolation implant into the trough, and
o) a dielectric layer on the trough.

Preferably, the isolation implant comprises boron ions within the range of from about $5 \times 10^{12}/\text{cm}^2$ to about $2 \times 10^{13}/\text{cm}^2$ implanted at about 30 keV; and the trough is about 3000 Å deep.

In another aspect of this invention, a self-aligned, split-gate EPROM/Flash EPROM array device, comprises:
a) a doped well in a semiconductor substrate of the device containing buried bit lines,
b) a dielectric layer on the surface of the doped well with a thick dielectric over the implanted ions,
c) a threshold voltage dopant in the doped well,
d) a first polysilicon floating gate on the silicon dioxide layer,
e) an inter polysilicon layer on the surface of the first polysilicon structures
f) a second polysilicon layer on the inter polysilicon layer in the form of a word line extending orthogonally to the buried bit lines and forming a stacked gate of a first transistor extending across the floating gate, and
g) an isolation transistor juxtaposed with the first transistor forming a split gate structure therewith.

BRIEF DESCRIPTION OF THE DRAWINGS

The foregoing and other aspects and advantages of this invention are explained and described below with reference to the accompanying drawings, in which:

FIGS. 2A–2F are sections taken along section line 2—2 in FIG. 1 showing the device of FIG. 1 made by a sequence of process steps.

FIGS. 3A–3F are sections taken along section line 3—3 in FIG. 1 of the device of FIG. 1 and FIGS. 2A–2F showing the same sequence of process steps as in FIGS. 2A–2F along a different section line.

FIGS. 4A–4F show sections along section line 4—4 in FIG. 1.

FIG. 5 shows a section taken along section line 5—5 in FIG. 1.

DESCRIPTION OF THE PREFERRED EMBODIMENT

Figure 1:
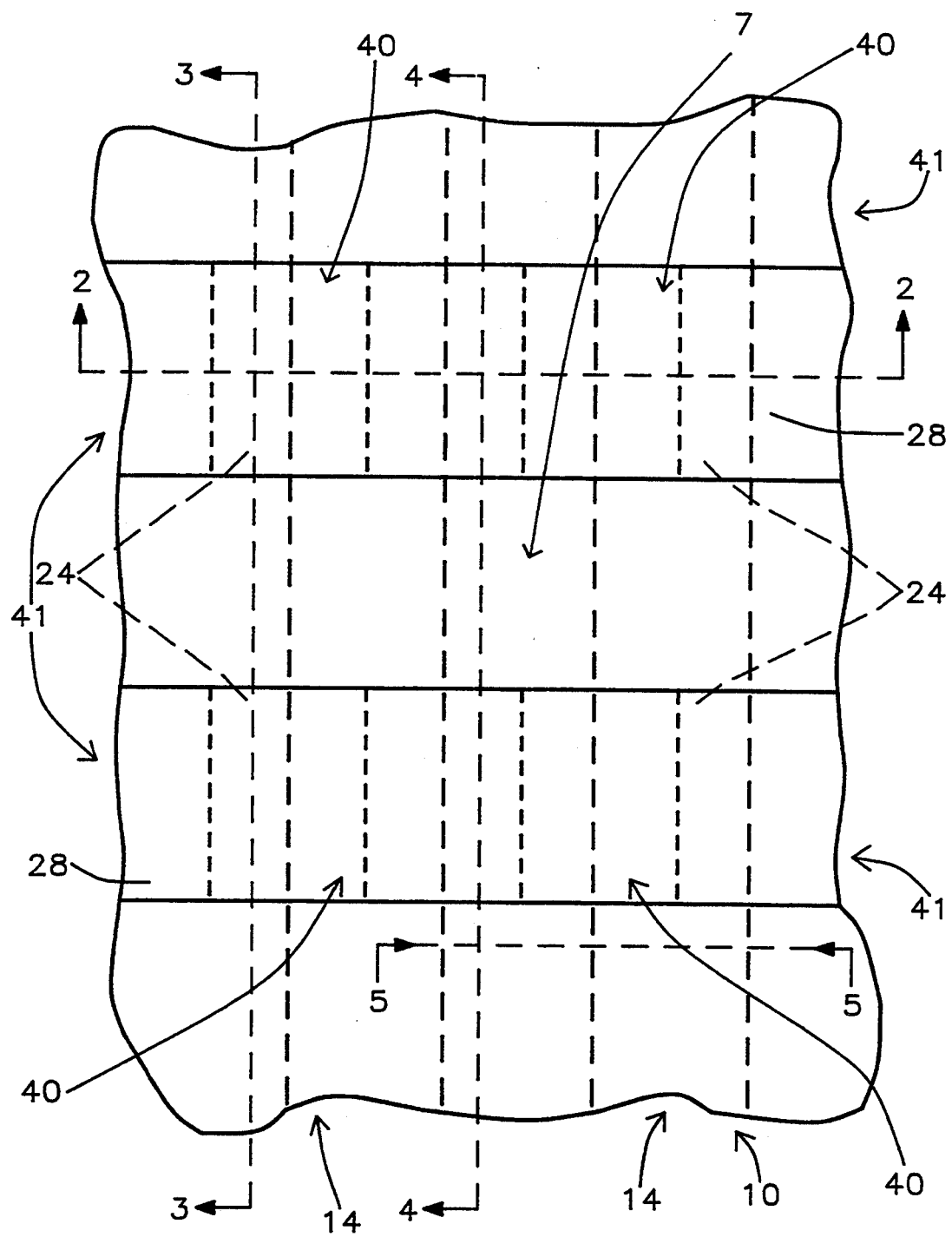
FIG. 1 shows a plan view of a "fieldless", self-aligned, split-gate EPROM/Flash EPROM array silicon device made in accordance with this invention.

FIG. 1 shows a plan view of a "fieldless", self-aligned, split-gate EPROM/Flash EPROM array silicon device 10 made in accordance with this invention. A pair of buried N+ bit lines 14 are shown, in phantom, as being vertically oriented. Extending orthogonally to bit lines 14, on the surface of device 10, are polysilicon 2 word lines 28. (Polysilicon 2 is often referred to in the art as "poly 2".) Polysilicon 1 (often known as "poly 1") floating gates 24 are shown, in phantom, beneath polysilicon lines 2. Floating gates 24 and word lines 28 are stacked in an arrangement, in accordance with the design of an EPROM, referred to herein as stacked gates 40. A region 7 in the space surrounded by all of the above structures is not covered by a field oxide ("fieldless".) It is necessary to implant boron (with a dose preferably $<1 \times 10^{13}/\text{cm}^2$) into the region 7. This implant can be a blank implantation to isolate the bit lines 14.

As a result of there being no field oxide in the region 7, it is not necessary to use a conventional silicon nitride layer and the conventional process to define the active area of the device 10. In addition, no bird's beak area formation is produced as a result of the field oxidation process. Accordingly, the cell size can be reduced further.

Figure 3A:
Figure 3A:
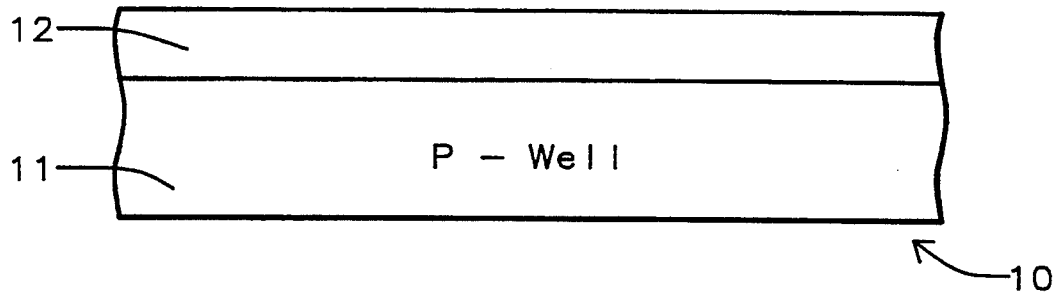
Figure 3B:
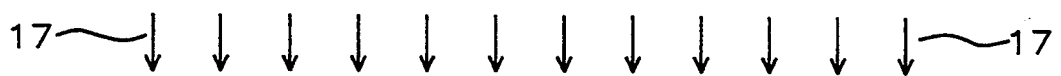
Figure 3B:
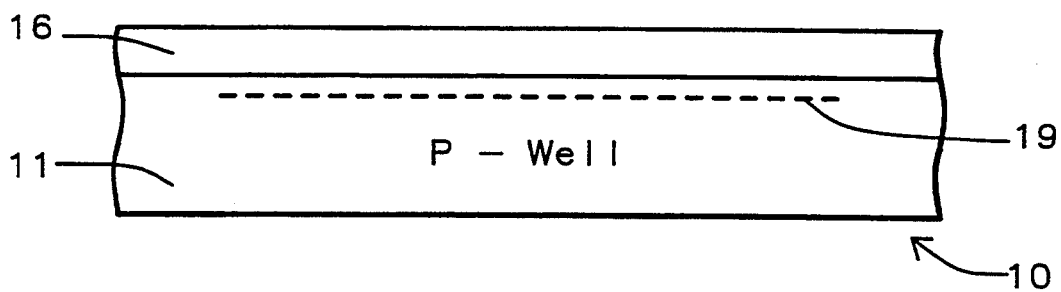
Figure 3C:
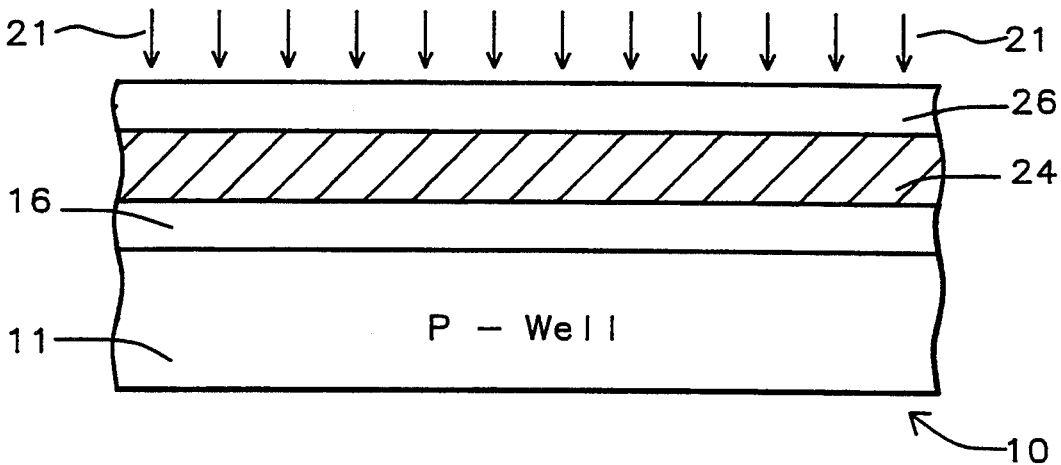
Figure 3D:
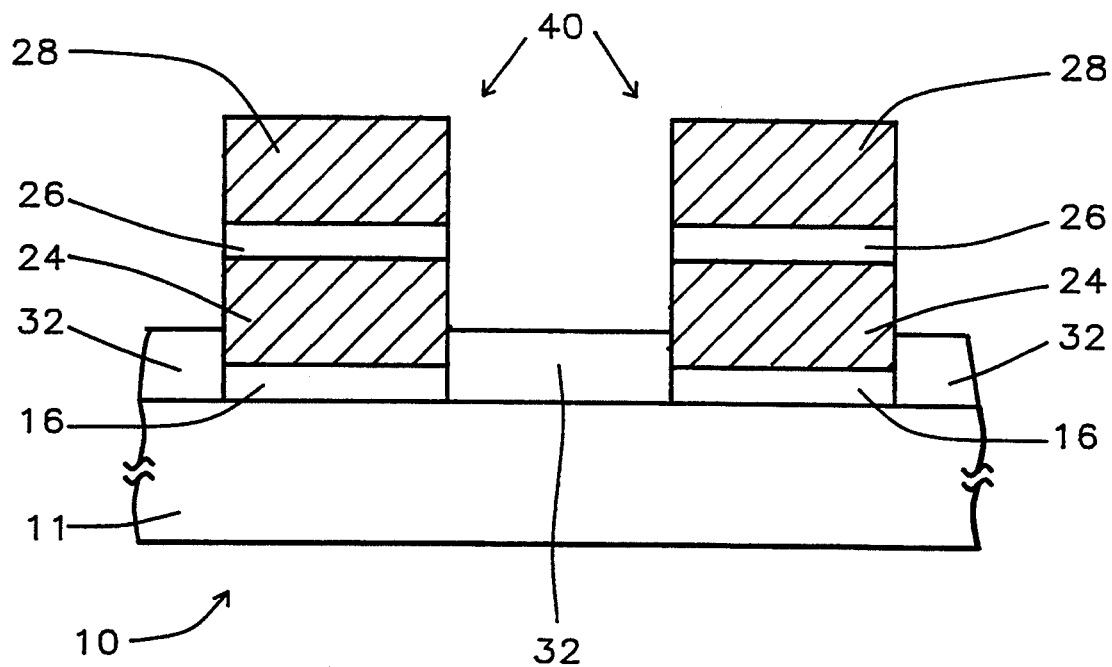

FIGS. 2A–2F, FIGS. 3A–3F, FIGS. 4A–4F, and FIG. 5 show cross-sectional views of several of a sequence of processing steps in accordance with this invention for forming the device of FIG. 1. FIGS. 2A–2F are sections taken along section line 2-2 in FIG. 1 showing the device of FIG. 1 made by a sequence of process steps. FIGS. 3A–3F are sections taken along section line 3—3 in FIG. 1 of the device of FIG. 1 and FIGS. 2A–2F showing the same sequence of process steps as in FIGS. 2A–2F. FIGS. 4A–4F show sections along section line 4—4 in FIG. 1. FIG. 5 shows a section taken along section line 5—5 in FIG. 1.

Figure 2A:
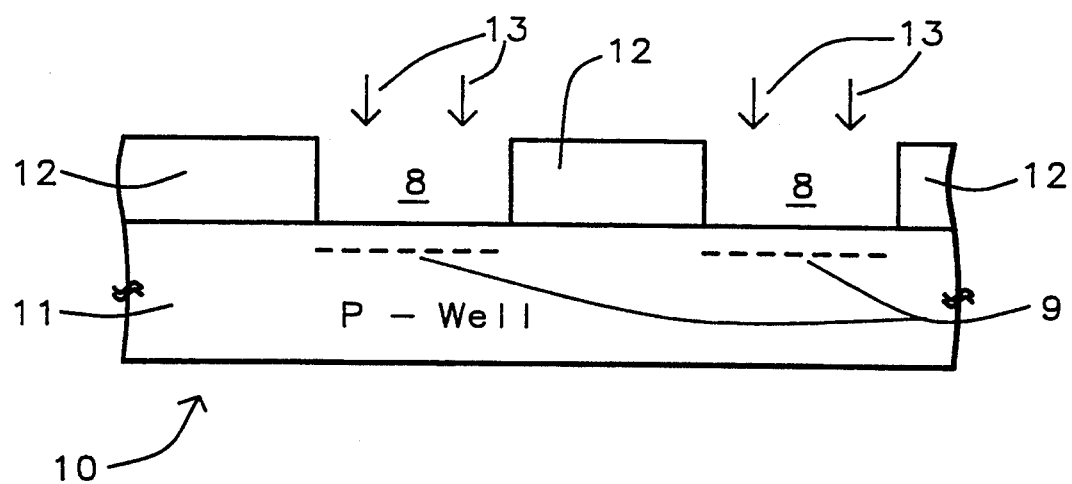
FIGS. 2A–2F, FIGS. 3A–3F, FIGS. 4A–4F, and FIG. 5 show cross-sectional views of several of a sequence of processing steps in accordance with this invention for forming the device of FIG. 1.

FIG. 2A shows a P- well 11 of doped silicon in the device 10. P- well 11 is covered with a photoresist mask 12 which is patterned with openings 8 into which ions 13 of N+ dopant, preferably arsenic, is implanted into the P-well 11 below the openings as represented by dopant 9 therein.

Figure 2B:
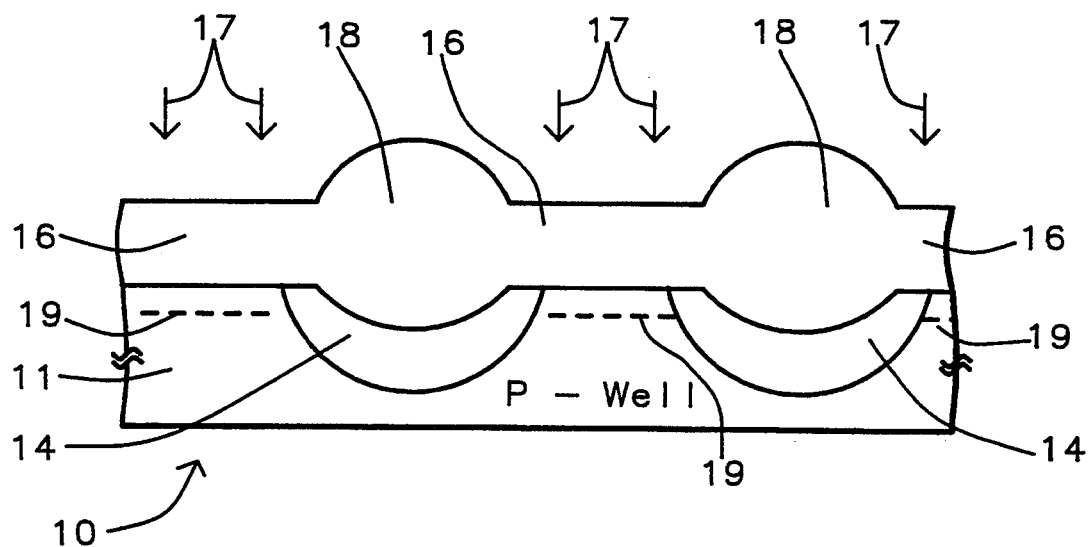

FIG. 2B shows a layer of gate oxide 16 formed on the product of FIG. 2A, having a thickness of about 100 Å. The thicker oxide structures 18 are formed where the buried N+ arsenic dopant 9 is in the P- well 11 having a thickness of from about 300 Å to about 600 Å. A buried N+ structure 14 is formed beneath each thicker oxide structure 18, as will be well understood by those skilled in the art.

Next, again referring to FIG. 2B, after the formation of the gate oxide layer 16 and oxide structures 18, a threshold voltage $V_{T1}$ ion implantation of boron ions 17 is performed producing boron dopant 19 composed as shown in P- well 11.

Figure 2C:
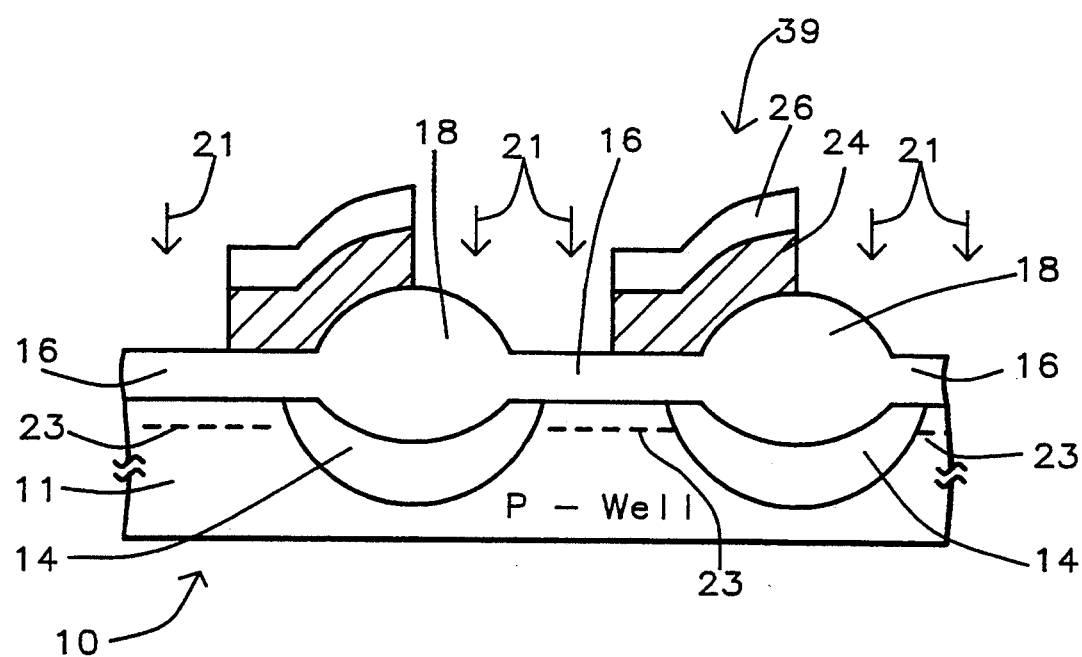

Referring to FIG. 2C, polysilicon 1 layer 24 is deposited on the product of FIG. 2B. Next, a layer of inter polysilicon dielectric 26 has been formed on the top of polysilicon layer 24. The inter polysilicon dielectric layer 26 can be thermal oxide or ONO (oxide-nitride-oxide.) Such an ONO dielectric 26 can be formed by a thin thermal oxide having a thickness of about 80 Å followed by a deposition by LPCVD of silicon nitride having a thickness of about 100 Å and final thermal oxidation or CVD oxide having a thickness from about 20 Å to about 50 Å.

By means of a photolithographic mask and etching the polysilicon 1 layer 24 and the dielectric 26 are formed into structures 24 located as shown in phantom in FIG. 1 in a floating gate configuration located about half upon the structures 18 and about half on the gate oxide structures 16. After etching the remaining material from polysilicon 1 layer 24 comprises the floating gates of the memory cell.

Referring again to FIG. 2C, after the etching of polysilicon 1 layer 24, a, a $V_{T2}$ ion implantation of ions 21 composed of boron is performed implanting the boron ions 21 to form boron dopant 23 in P- well 11. The dose of the boron ions implanted should be within the range from about $1 \times 10^{11}/cm^2$ to about $5 \times 10^{12}/cm^2$ at from about 20 keV to about 50 keV. This step is optional depending upon the particular dopant employed in the threshold voltage $V_{T1}$ process described in connection with FIG. 2B.

Figure 2D:
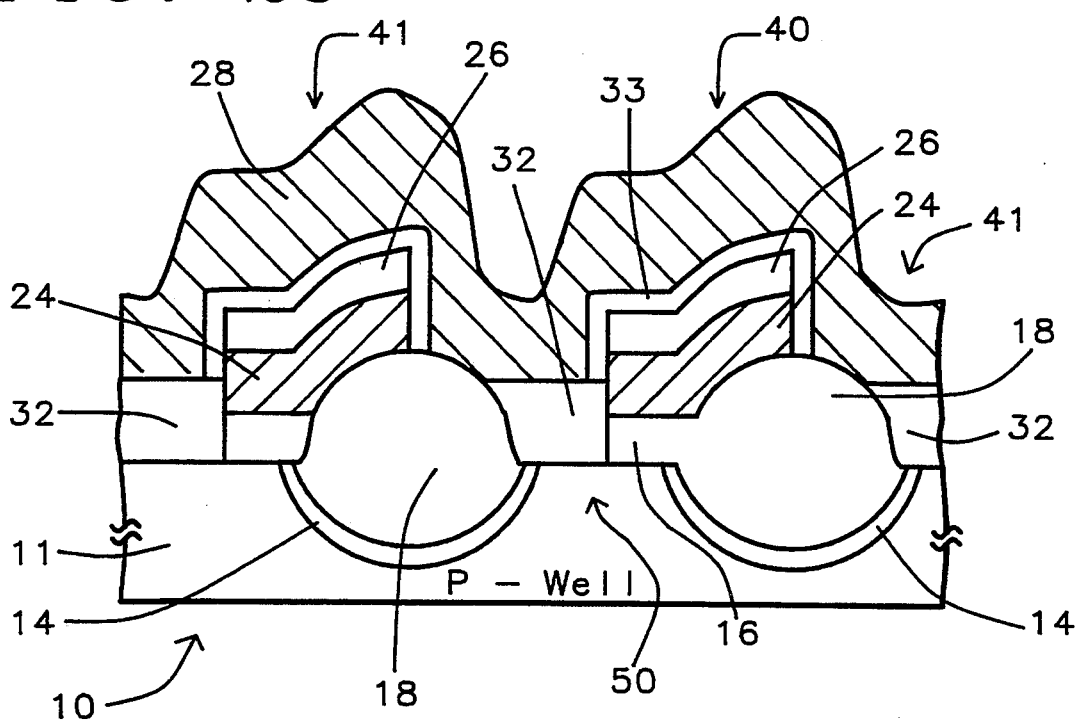

Referring to FIG. 2D a polysilicon 2 layer 28 is deposited on the product of FIG. 2C. The polysilicon 2 layer 28 is doped in the conventional manner.

Figure 2E:
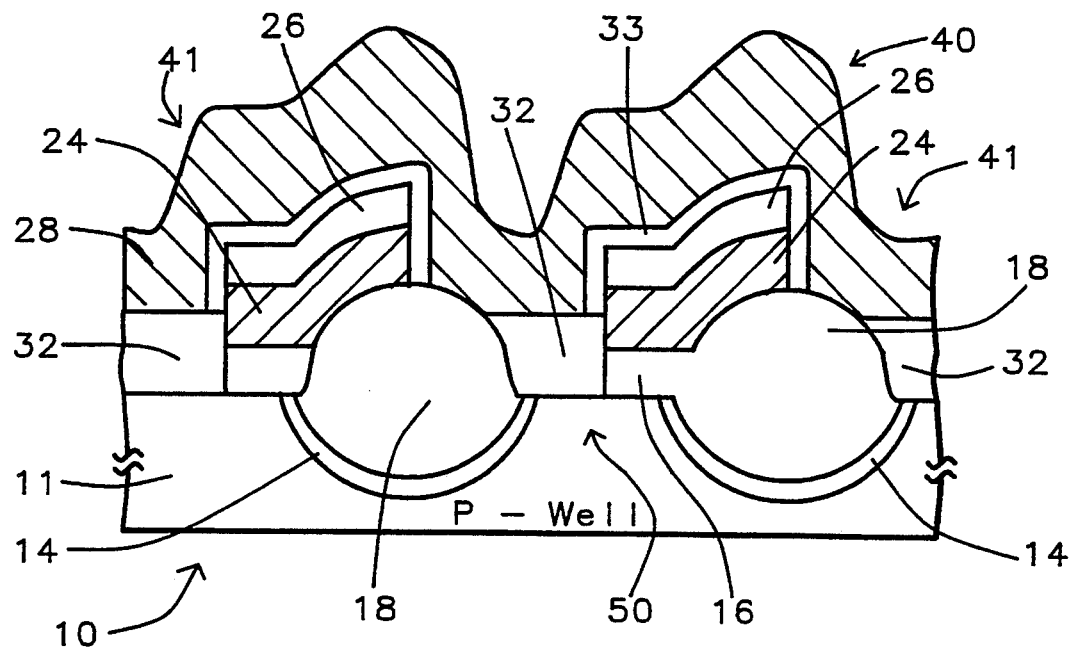
Figure 3E:
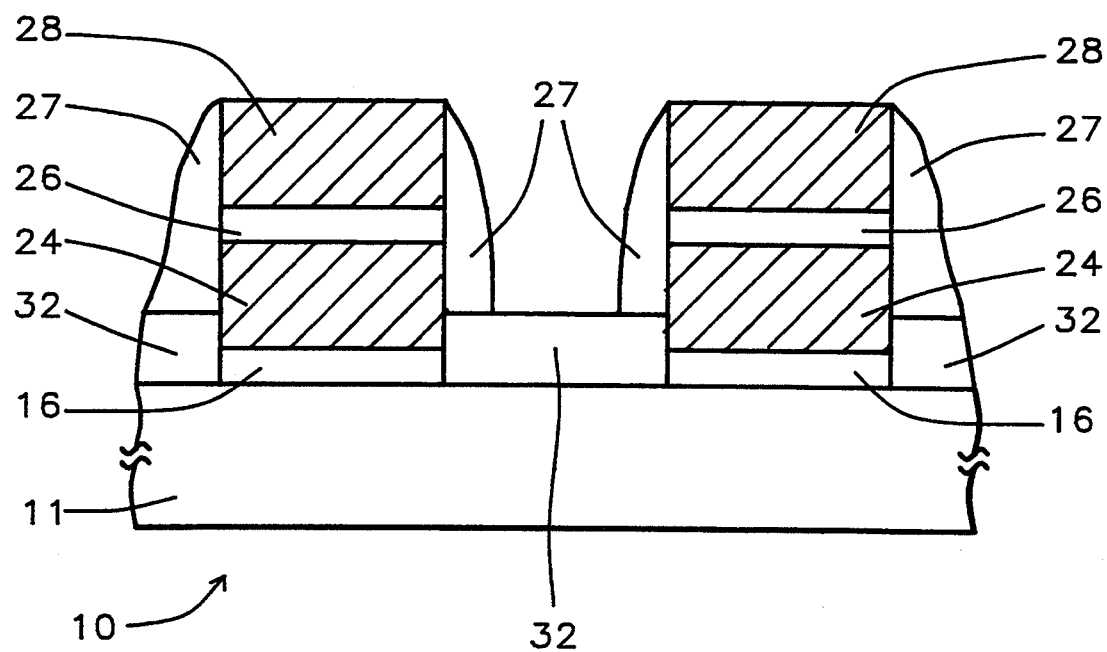
Figure 4A:
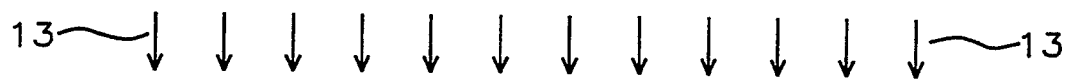
Figure 4A:
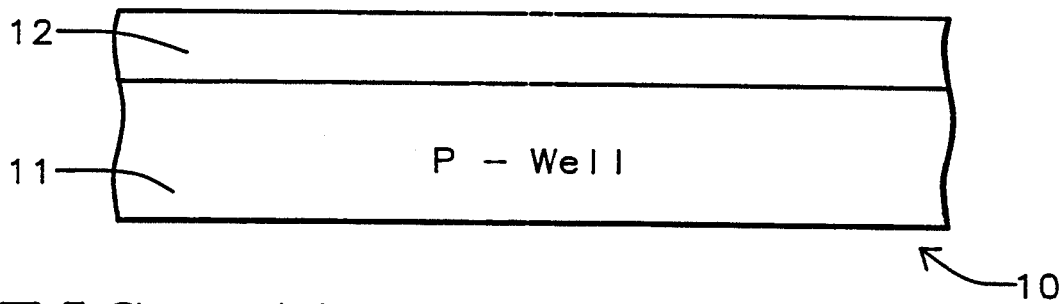
Figure 4B:
Figure 4B:
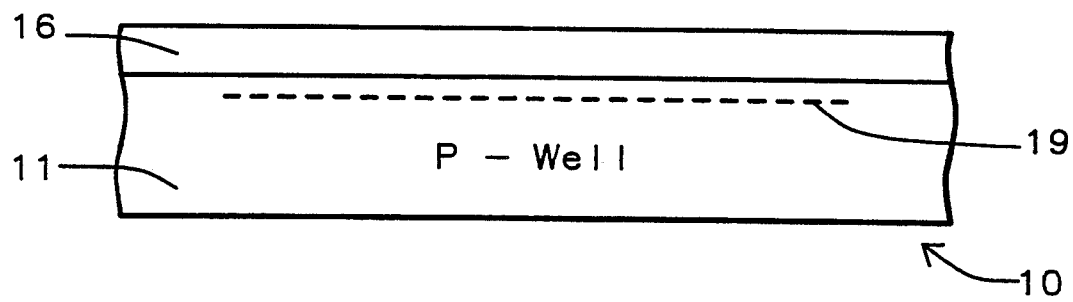
Figure 4C:
Figure 4C:
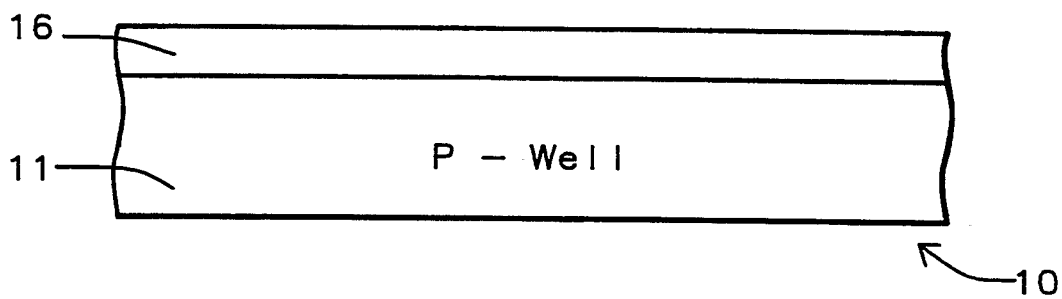
Figure 4D:
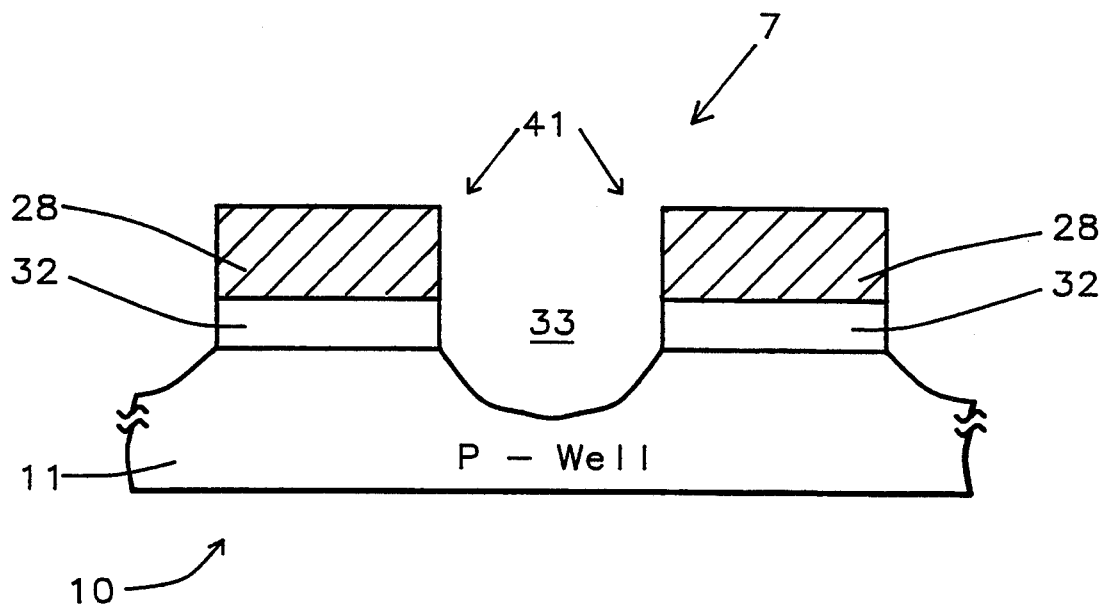
Figure 4E:
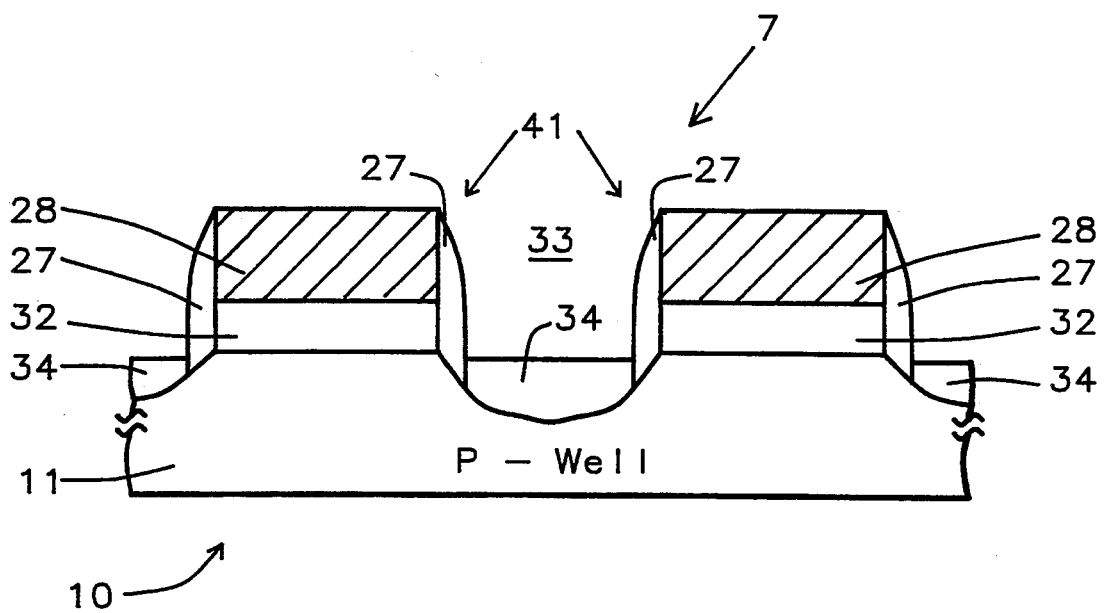
Figure 5:
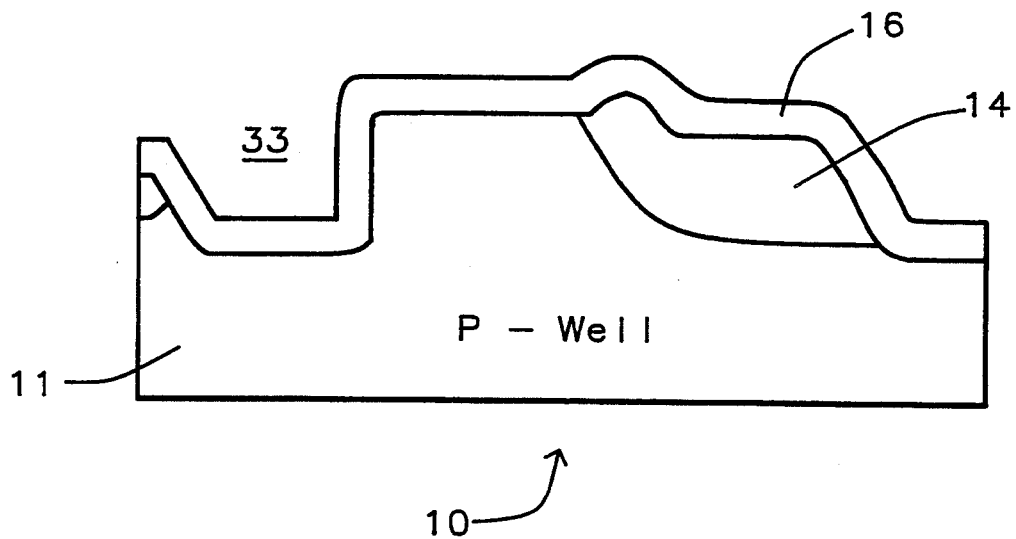

Referring to FIG. 2E, 3E and 4E no change has been made to this portion of the device.

Figure 2F:
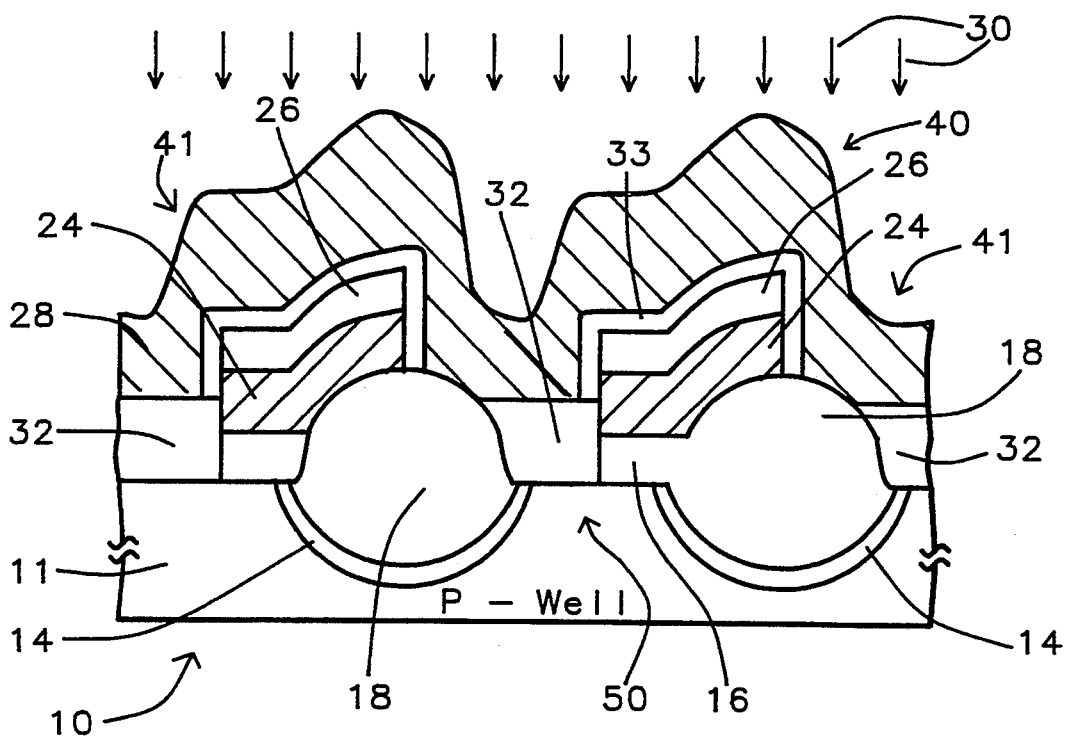
Figure 3F:
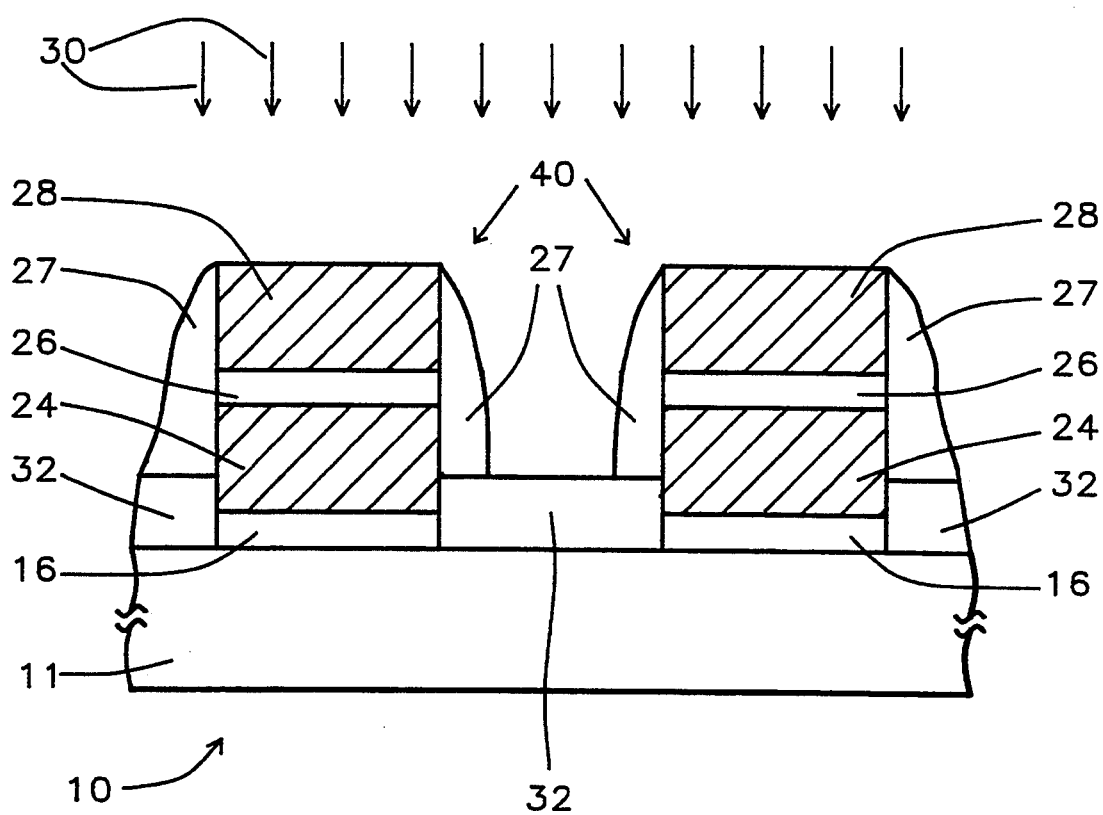
Figure 4F:
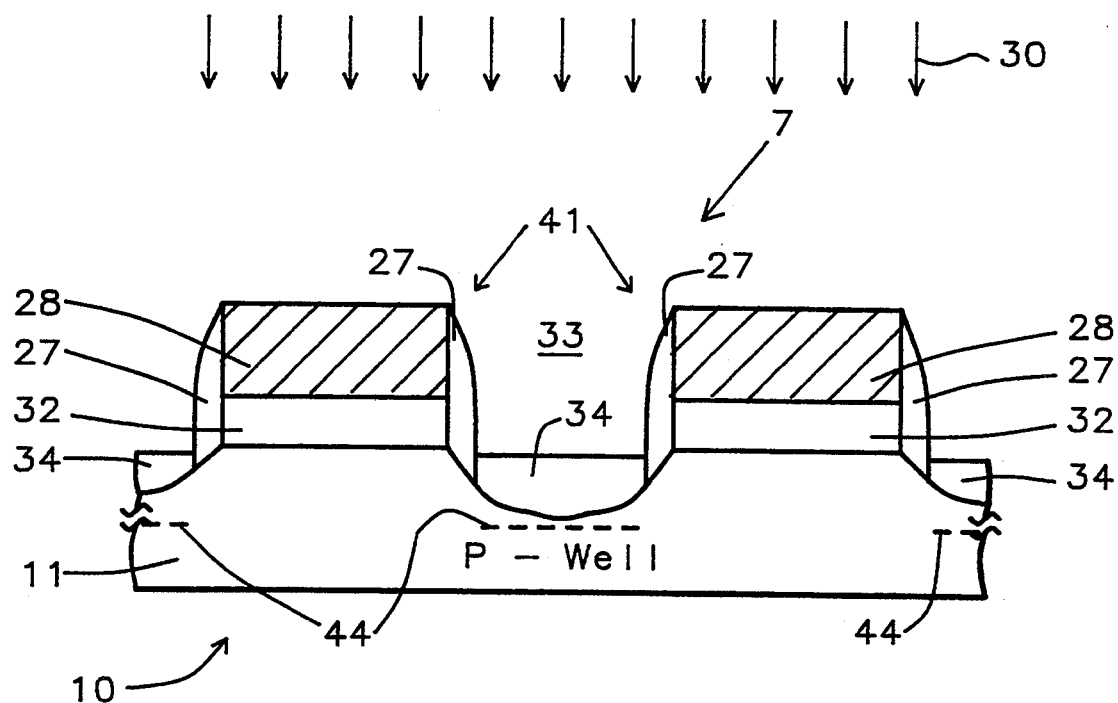

Referring to FIGS. 2F, 3F and 4F the gate oxide 16 not covered by polysilicon 1 floating gate 24 is etched away from the device of FIGS. 2E, 3E and 4E and then a 200 Å thick layer of isolation oxide 27 is grown in place of the oxide 16 as shown in FIGS. 3F and 4F.

Figure 6:
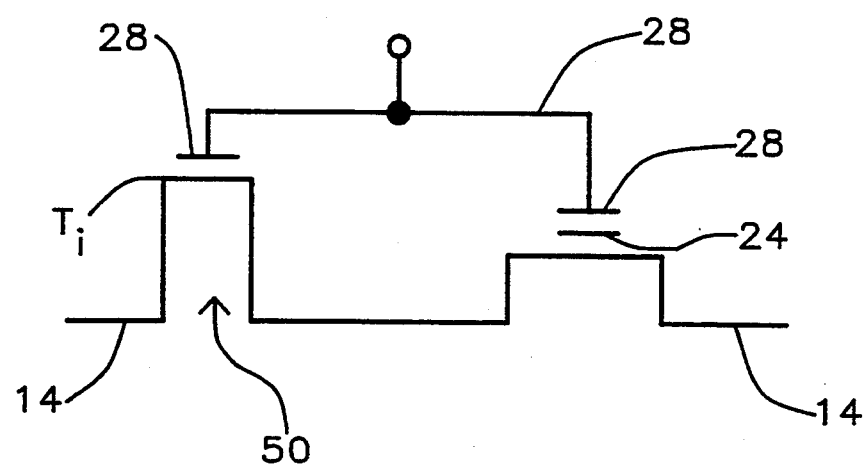
FIG. 6 shows an equivalent schematic circuit for the split gate structure of FIGS. 2D, 2E and 2F.

Referring to FIG. 2D, 2E, and 2F, in the region where the polysilicon 2 layer 28 extends down into contact with gate oxide layer 32, it forms an isolation transistor 50 forming a split gate structure as illustrated by FIG. 6.

FIG. 6 shows an equivalent schematic circuit for the split gate structure of FIGS. 2D, 2E and 2F. FIG. 6 shows that the stacked gate 28 is in series with the isolation transistor $T_i$ forming a split gate structure.

Step 1

The first step of this invention is the application of a mask layer 12 (photoresist from which a mask 12 is formed) to a semiconductor device with a P- well 11 which is illustrated. The photoresist from which mask 12 was formed was exposed to a mask to form openings 8 in FIG. 2A therein are opened, with no openings in FIGS. 3A and 4A.

Step 2

An N+ implant of ions 13 is performed, preferably employing ions of arsenic (As) dopant 9 through the openings 8 in mask 12 into the P- well 11 as shown in FIG. 2A. The dose of the arsenic ions implanted should be within the range from about $1 \times 10^{15}/cm^2$ to about $8 \times 10^{15}/cm^2$ at about 50 keV. In the cases of FIGS. 3A and 4A, mask 12 blocks the implantation of ions 13 into the P- well 11. The implantation of arsenic forms the buried bit line 14.

Step 3

The mask 12 is stripped.

Step 4

A gate oxide layer 16 generally having a thickness of about 100 Å is formed on the surfaces shown in FIGS. 2B, 3B and 4B employing a conventional process. However, thicker oxide structures 18 are formed above dopant 9 instead of the thin gate oxide layer 16 where the buried N+ arsenic dopant 9 enhances formation of oxide on the P- well 11, as shown in FIG. 2B. The thicker oxide structures 18 have a thickness of from about 300 Å to about 600 Å. In FIGS. 3B and 4B, there is simply the gate oxide layer 16, which is a tunnel oxide. This thin tunnel oxide will be the dielectric area for programming and erasing of electrons. A buried N+ structure 14 (which is the buried bit line of the memory array) is formed beneath each thicker oxide structure 18, during the formation of the gate oxide, as will be well understood by those skilled in the art.

Step 5

Next, again referring to FIG. 2B, after the formation of the gate oxide layer 16 and oxide structures 18, a $V_{T1}$ ion implantation of boron ions 17 composed is performed implanting boron dopant 19 in P- well 11. The dopant 19 from ions 17 are shown as being implanted in FIG. 2B between the thicker oxide structures 18. The dose of the boron ions implanted should be within the range from about $1 \times 10^{11}/cm^2$ to about $2 \times 10^{12}/cm^2$ at about 50 keV.

Step 6

Referring to FIGS. 2C, 3C and 4C, the polysilicon 1 layer 24 is deposited on the product of FIGS. 2B, 3B and 4B after further patterning is absent from portions of FIG. 2C and all of FIG. 4C, as will be understood by the description elsewhere herein. The polysilicon 1 layer 24 is doped in the conventional manner.

Step 7

Referring to FIGS. 2C, 3C and 4C a layer of inter polysilicon dielectric 26 has been formed on the top of polysilicon 1 layer 24. The inter polysilicon dielectric can be thermal oxide or ONO (oxide-nitride-oxide.) The ONO can be formed by a thin thermal oxide having a thickness of about 80 Å followed by LPCVD of silicon nitride having a thickness of from about 100 Å to about 200 Å and final thermal oxidation or CVD oxide having a thickness from about 20 Å to about 50 Å.

Step 8

By means of a photolithographic mask and etching, referring to FIG. 2C, the layer 24 and the inter polysilicon dielectric 26 are formed into structures 24 and 26 which in FIG. 2C are gates located as shown in phantom in FIG. 1 as the lower part of a split gate configuration located about half upon the structures 18 and about half on the gate oxide structures 16. However, in the cases of FIG. 3C which is a section through the polysilicon line 24 as shown in FIG. 1, none of the polysilicon line 24 is etched away in FIG. 3C.

Referring to FIG. 4C, the polysilicon layer 24 and the polysilicon dielectric (ONO) dielectric 26 are entirely etched away at this stage of the process, and the gate oxide layer 16 is reduced below the initial thickness of about 100 Å to from about 30 Å to about 70 Å.

Step 9

Referring to FIG. 2C, after the etching of the gate dielectric 26 and polysilicon 1 layer 24, a $V_{T2}$ ion implantation of boron ions 21 forming boron dopant in P- well 11. The dose of the boron ions implanted should be within the range from about $1 \times 10^{11}/cm^2$ to about $5 \times 10^{12}/cm^2$ at about 30 keV. This step is optional depending upon the particular dopant employed in the threshold voltage $V_{T1}$ process described in connection with FIG. 2B.

Step 10

After the process of etching in step 9, the silicon dioxide layer 16 on the surface of the device 10, which is not covered by polysilicon 1 layer 24 (and ONO 26) must be removed by etching the silicon dioxide layer 16.

Step 11

In place of silicon dioxide layer 16, which was about 100 Å thick, a new silicon dioxide layer 32, as seen in FIG. 2D and FIG. 3D, and FIG. 4D which oxide layer 32 is preferably about 200 Å thick is grown or regrown, preferably by the steps of conventional thermal oxidation.

Step 12

Referring to FIGS. 2D, 3D and 4D, the polysilicon 2 layer 28 is deposited on the product of FIG. 2C, 3C and 4C. The polysilicon 2 layer 28 is doped in the conventional manner.

Step 13

Next is the process of etching to form the stacked gates 40 by etching polysilicon 2 layer 28, ONO dielectric 26 and polysilicon 1 layer 24 resulting in a pit 33 extending substantially into the P- well 11 in FIG. 3D. By means of a photolithographic mask and etching, the layer of polysilicon 2 layer 28 and portions of polysilicon 1 layer 24 and inter polysilicon dielectric 26 are etched to form the patterns shown in FIGS. 2D, 3D and 4D the layer 28 is formed. Referring to FIGS. 2C and 2D, the structure 39 of FIG. 2C becomes gate 40 on gates in FIG. 2D located as shown in FIG. 1, as the upper part of a floating gate configuration located about half upon the structures 18 and about half on the gate oxide structures 16. Lines of polysilicon 2 layer 28 cross over gate 40 forming a control gate or a word line 41. The polysilicon 2 over polysilicon 1 layer 24 forms stacked gates. The polysilicon 2 layer over the gate oxide area forms an isolation transistor. The stacked gate in series with the isolation transistor forms a split gate structure. In the cases of FIG. 3D, a section is shown through the floating gate 40 along line 3—3 in FIG. 1. Referring to FIG. 4D, the polysilicon layer 28 is shown with a section through a pair of word lines 41, with a trough 33 etched down into the P- well 11. The trough 33 is about 3000 Å deep.

Step 14

Next oxide spacer structures 27 are formed on the sides of the gates 40 and the word lines 41 in FIGS. 3E and 4E. In the case of the sections in FIG. 2E, the polysilicon layer 28 is present so no spacer structures 27 are formed in FIG. 2E. The oxide spacer is formed due to the requirements of peripheral transistors (LDD structure for peripheral transistors.)

Step 15

An isolation implant of boron ions 30 shown in FIGS. 2F, 3F and 4F (preferably less than about $1 \times 10^{13}/cm^2$) is employed resulting in dopant 44 being formed in the P- well 11 in FIGS. 3F and 4F, in regions where the gates 40 and the word lines 41 are absent. The dose of the boron ions 30 implanted should be within the range from about $5 \times 10^{12}/cm^2$ to about $2 \times 10^{13}/cm^{13}$ at about 30 keV. The dose used for boron isolation (avoiding the punchthrough between bit lines) and good bit line Junction breakdown (for programming and erasing, a certain high voltage is often needed to be applied at drain or source junction.)

These areas with boron ions 30 are the field areas between the word lines 41 and the bit lines 14, but there is no thick field oxide. This "fieldless" process utilizes this step of isolation boron implantation to isolate the active areas which enables shrinking the size of cells to an improved smaller scale.

Step 16

A step of oxidation/annealing after the boron ion implantation in step 15 forms a silicon dioxide layer 34 between the gates 40 and word lines 41. The combination of the boron ion implantation in step 15 and this step of oxidation can result in good isolation an no leakage between word lines 41 and bit lines 14, also.

Step 17

The standard CMOS process follows including source/drain formation.

Step 18

The next step in the CMOS process is formation of peripheral devices.

Step 19

Standard CMOS process reflow.

Step 20

Formation of contacts.

Step 21

Metallization.

Step 22

Alloy formation.

Step 23

Standard processing steps follow step 22, as will be well understood by those skilled in the art.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a self-aligned, split-gate EPROM/Flash EPROM array device, comprising the following steps:
   a) implanting ions into locations in a doped well in a semiconductor substrate of said device to form buried bit lines,
   b) forming a dielectric layer on the surface of said doped well forming a thicker dielectric over said implanted ions,
   c) implanting a first threshold voltage $V_{T1}$ dopant into said doped well,
   d) forming a first polysilicon layer on said silicon dioxide layer,
   e) forming an inter polysilicon layer on the surface of said first polysilicon layer on said device,
   f) patterning said first polysilicon layer by forming a mask with openings and etching said polysilicon through said openings in said mask,
   g) forming a second polysilicon layer on said inter polysilicon layer, h) forming a photolithographic mask and etching portions of said second polysilicon layer to form word lines therein, and etching portions of said first polysilicon layer and said inter polysilicon dielectric to form a stacked gate beneath said word lines with a trough etched down into said well in the space defined within said buried bit lines and said second polysilicon layer, and i) implanting an isolation implant into said trough, whereby preliminary manufacture of said device is completed.

2. A method in accordance with claim 1 wherein said isolation implant comprises boron ions within the range of from about $5 \times 10^{12}/cm^2$ to about $2 \times 10^{13}/cm^2$ implanted at about 30 keV.

3. A method in accordance with claim 2 wherein said trough is about 3000 Å deep.

4. A method in accordance with claim 3 wherein dielectric structures are formed on the sides of said gate and said word lines.

5. A method in accordance with claim 4 wherein a dielectric layer is formed on said trough.

6. A method of manufacture of a self-aligned, split-gate EPROM/Flash EPROM array device, comprising the following steps:

a) implanting ions into locations in a doped well in a semiconductor substrate of said device to form buried bit lines, b) forming a silicon dioxide layer on the surface of said doped well forming thicker oxide over said implanted ions, c) implanting a first threshold voltage $V_{T1}$ dopant into said doped well, d) forming a first polysilicon layer on said silicon dioxide layer, e) forming an inter polysilicon layer on the surface of said first polysilicon layer on said device, f) patterning said first polysilicon layer by forming a mask with openings and etching said polysilicon through said openings in said mask, g) implanting a second threshold voltage $V_{T2}$ dopant into said doped well, h) removing the exposed portions of said silicon dioxide layer exposing the surface of said doped well, i) forming a second silicon dioxide layer on the exposed surface of said doped well, j) forming a second polysilicon layer on said inter polysilicon layer, k) forming a photolithographic mask and etching portions of said second polysilicon layer to form word lines therein, and etching portions of said first polysilicon layer and said inter polysilicon dielectric to form a stacked gate beneath said word lines with a trough etched down into said well in the space defined within said buried bit lines and said second polysilicon layer, and l) implanting an isolation implant into said trough, whereby preliminary manufacture of said device is completed.

7. A method in accordance with claim 2 wherein dielectric structures are formed on the sides of said gate and said word lines.

8. A method in accordance with claim 7 wherein a dielectric layer is formed on said trough.

* * * * *